(12) United States Patent
Schmid et al.

(10) Patent No.: US 8,624,767 B2
(45) Date of Patent: Jan. 7, 2014

(54) ELECTRONIC DEVICE AND METHOD FOR ANALOG TO DIGITAL CONVERSION ACCORDING TO DELTA-SIGMA MODULATION USING DOUBLE SAMPLING

(75) Inventors: Konstantin Schmid, Hammelberg (DE); Michael Reinhold, Erlangen (DE); Frank Ohnhaeuser, Stein (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/603,179

(22) Filed: Sep. 4, 2012

(65) Prior Publication Data

US 2013/0278454 A1    Oct. 24, 2013

(30) Foreign Application Priority Data

Apr. 24, 2012   (EP) .................................... 12002892

(51) Int. Cl.
*H03M 3/00*       (2006.01)
(52) U.S. Cl.
USPC .......................................... 341/143; 341/172
(58) Field of Classification Search
USPC .................. 341/143, 172, 156, 155, 120, 161
See application file for complete search history.

(56) References Cited

U.S. PATENT DOCUMENTS 6,972,705 B1 * 12/2005 Fei et al. ....................... 341/143

OTHER PUBLICATIONS

"A Second-Order Double-Sampled Delta-Sigma Modulator Using Additive-Error Switching," IEEE Journal of Solid-State Circuits, vol. 31, No. 3, Mar. 1996, pp. 284-293 (.

* cited by examiner

*Primary Examiner* — Joseph Lauture
(74) *Attorney, Agent, or Firm* — Alan A. R. Cooper; W. James Brady, III; Frederick J. Telecky, Jr.

(57) ABSTRACT

The modulator comprises a first and second integration stages, and a comparator, the first integration stage is fully differential having: an amplifier, sets of input sampling capacitors and feedback capacitors, and the first integration stage is configured to sample the analog input voltage on a set of input capacitors during a first portion of a clock cycle and on a set of input capacitors during a second portion of the clock cycle and to sample the feedback reference voltage on a set of feedback capacitors during the first portion of the clock cycle and on a set of feedback capacitors during the second portion of the clock cycle, and the first set of feedback capacitors and the second set of feedback capacitors are randomly selected out of the plurality of sets of feedback capacitors from cycle to cycle.

5 Claims, 6 Drawing Sheets

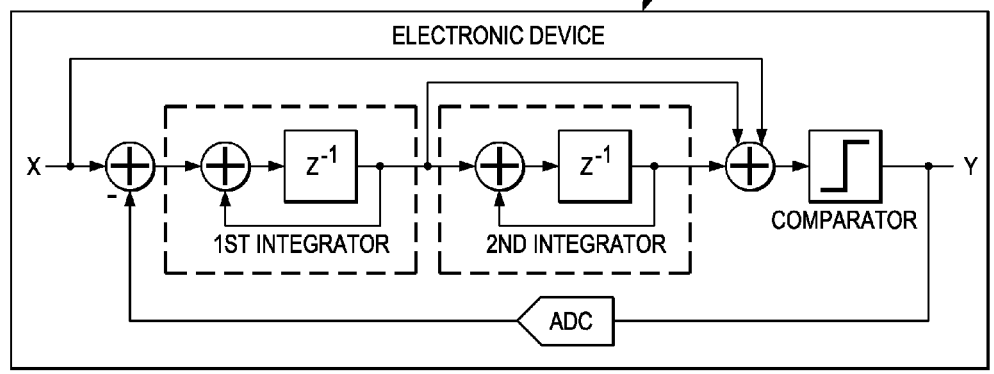
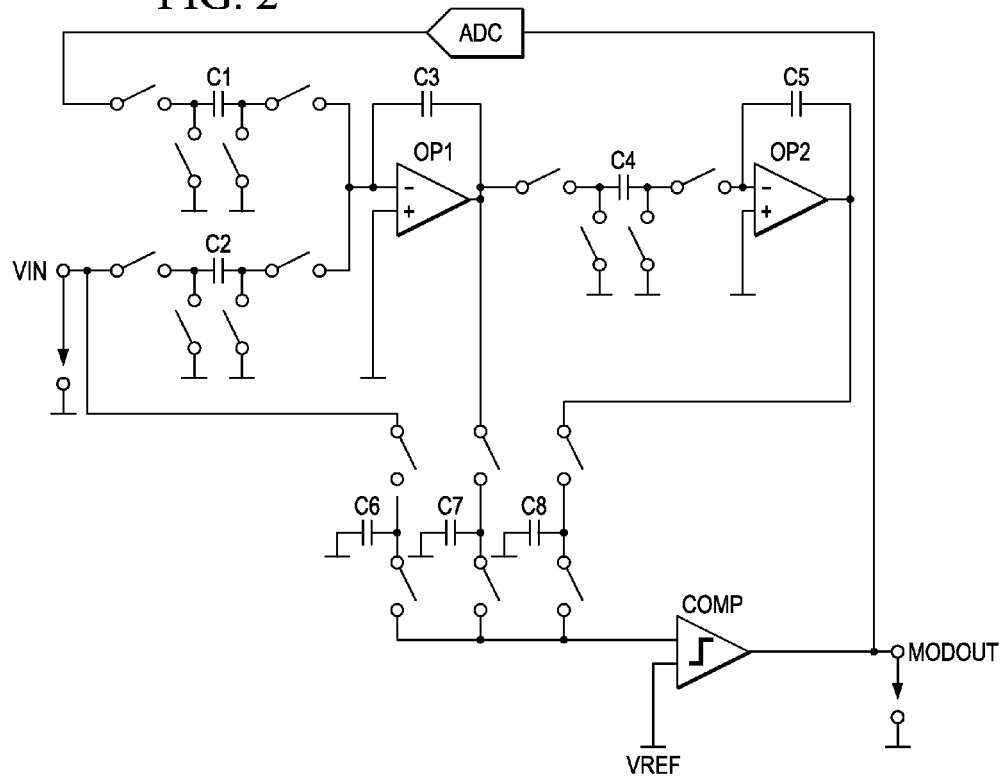

ELECTRONIC DEVICE AND METHOD FOR ANALOG TO DIGITAL CONVERSION ACCORDING TO DELTA-SIGMA MODULATION USING DOUBLE SAMPLING

CROSS-REFERENCE TO RELATED APPLICATIONS

This application is claims priority from European Patent Application No. 12002892.3, filed Apr. 24, 2012, which is hereby incorporated by reference for all purposes.

FIELD OF THE INVENTION

The invention relates to an electronic device and a method for analog-to-digital conversion, and more specifically to an electronic device and a method for analog-to-digital conversion according to Delta-Sigma modulation using double sampling.

BACKGROUND

Delta-Sigma modulation (also referred to as Sigma-Delta modulation) is one of the widely used principles for analog-to-digital conversion.
Delta-Sigma modulation is based on oversampling and noise-shaping providing among others a large dynamic range which is desirable for many applications. The term noise-shaping refers to the effect that the modulator moves the quantization noise to a frequency range outside the signal frequency range such that it can easily be suppressed in a digital post-processing step through digital filtering.

The Delta-Sigma modulator receives the analog signal at its input and provides the oversampled digital data at its output. Digital data appears with the high oversampling rate of the modulator at the modulator output and has a rather small bitwidth. Many modulator types use only a single-bit comparator which means that they output a digital single-bit stream. This single bit stream is typically filtered in order to remove undesired quantization noise and to receive multi-bit words of the desired resolution (for example 8, 16, 20 or more bit) at a lower sampling frequency. This means that a complete Delta-Sigma analog-to-digital converter comprises a modulator and digital filter.

The main factors for achieving a high signal-to-noise ratio and a large dynamic range are the oversampling factor and the order of the Delta-Sigma modulator. The oversampling rate is the quotient of sampling rate of the modulator divided by the Nyquist frequency.

The higher the sampling rate (and thereby the oversampling ratio) and/or the order of a modulator, the higher is the achievable dynamic range. However, with an increasing sampling rate and/or order of the modulator, the power consumption and the complexity also increase.

There are various different architectures for Delta-Sigma modulators each having their specific advantages and disadvantages. The order of a Delta-Sigma modulator is primarily determined by the number of integrators (or integration stages) of the modulator. The integrators or integration stages are often implemented as switched capacitor circuits.

A second order Delta-Sigma modulator mainly comprises two integrators, a comparator and a digital-analog converter. A system theoretical structure of a feedforward second order modulator is shown in FIG. 1. The output signal of the first integrator, the output signal of the second integrator and the input signal are directly fed to the comparator input. At the input summing point, a reference signal depended on the comparator output signal of the last integration step (second integrator) is subtracted from the input signal. The resulting signal corresponds to the quantization error.

In a feedback architecture, the reference signal would be subtracted from the input signal and the output of the first integrator. The comparator input signal would be the output signal of the second integrator.

The way of interconnecting the integration stages, the comparator and the inputs and outputs in accordance with a given modulator architecture determines the signal and noise transfer functions of a modulator, as it is well known to those skilled in the art.

Other factors that influence the performance of a Delta-Sigma modulator and thereby the performance of the analog-to-digital converter using the Delta-Sigma modulator are, for example the noise introduced through the supply and reference voltages, the characteristics of the comparator and matching of the used components.

The maximum theoretically achievable signal-to-noise ratio of a Delta-Sigma modulator can also be increased, if a multi-bit comparator instead of a single-bit comparator is used. However, using multi-bit comparators entails other problems and may, for example affect linearity of the Delta-Sigma modulator. The most robust solution is a single-bit comparator.

The first integrator or integration stage of the modulator has a major influence on the overall performance of the Delta-Sigma modulator. The present invention therefore focuses on an improved architecture for the first integrator. As previously described, one possibility to improve the performance of a Delta-Sigma modulator consists in increasing the oversampling ratio, which however, usually entails higher power consumption.

Increasing the sampling rate without substantially increasing the power consumption or maintaining the sampling rate while decreasing the power consumption can be achieved by a technique which is referred to as double sampling. Using double sampling for Delta-Sigma modulators is generally known in the art. There are various double sampling Delta-Sigma modulators known in the art, as for example from "A second-order double-sampled delta-sigma modulator using additive-error switching", Burmas, T. V.; Dyer, K. C.; Hurst, P. J.; Lewis, S. H.; Solid-State Circuits, IEEE, Volume: 31 Issue:3, pages 284-293. There are various drawbacks of the solutions given in the above cited reference. These drawbacks relate to the specific way of sampling, the use of the capacitors during sampling, the comparators and the general architectures of the Delta-Sigma modulators.

SUMMARY

It is an object of the invention to provide an electronic device and an architecture for analog-to-digital conversion according to Delta-Sigma modulation using double sampling which has a better performance than the solutions according the prior art. According to an aspect of the invention, an electronic device for analog-to-digital conversion is provided. The analog-to-digital conversion is performed according to Delta-Sigma modulation. There is at least a first switched capacitor integration stage, a second switched capacitor integration stage and a single bit comparator. The first switched capacitor integration stage can be implemented in a fully differential architecture. The other parts of the electronic device may then also be configured according to fully differential architectures. Furthermore, the first switched capacitor integration stage can comprise an operational amplifier, integration capacitors coupled between input(s) and output(s) of the operational amplifier, a plurality of sets of input sampling capacitors for sampling an analog input voltage and a plurality of sets of reference feedback capacitors for sampling a feedback reference voltage. The first integration stage can then be configured to sample the analog input voltage on a first set of input capacitors out of the plurality of sets of input capacitors during a first portion of a clock cycle. The first integration stage is further configured to sample the analog input voltage on a second set out of the plurality of sets of input capacitors during a second portion of the clock cycle. Furthermore, the first integration stage is configured to sample the feedback reference voltage on a first set of reference feedback capacitors out of the plurality of sets of reference feedback capacitors during the first portion of the clock cycle and on a second set of reference feedback capacitors out of the plurality of sets of reference feedback capacitors during the second portion of the clock cycle. The first set of reference feedback capacitors and the second set of reference feedback capacitors are randomly selected out of the plurality of sets of reference feedback capacitors from clock cycle to clock cycle. This aspect of the invention provides that dual sampling of the feedback reference voltage in combination with random selection of sets of reference feedback capacitors out of a plurality of sets of reference feedback capacitors is used. The sampling frequency can then be maintained so that the time for charging and discharging the capacitors is increased, which reduces the power consumption of the operational amplifier. In a different embodiment, the sampling frequency may be increased in order to improve the performance of the analog-to-digital conversion. Any non-linearities due to mismatch of the reference feedback capacitors are eliminated or suppressed using the random exchange of sets of reference feedback capacitors.

The electronic device can further be configured to change the polarity of the integration capacitors and the analog input voltage with respect to each set of input capacitors from clock cycle to clock cycle. This aspect provides that a chopper-principle is applied. This chopper-principle eliminates distortion along the whole signal path, i.e. distortion of the sampled signals signal due to mismatch of the input capacitors network and the effect of offset of the amplifier.

The plurality of reference feedback capacitors can comprise more than two pairs, for example four pairs of capacitors. Each pair can represent a randomly selected set of feedback capacitors.

The plurality of sets of input capacitors can comprise two pairs of capacitors each pair representing a set of input capacitors.

Input and output common mode voltage can be separately adjusted for example by additional capacitors. This adjustment has to be performed in accordance with the double sampling techniques. According to an aspect of the invention, separate capacitors for defining the input common mode can be used.

The input capacitors and reference feedback capacitors can be coupled in parallel to the inputs of the operational amplifier. This provides that the charge that is transferred to the integration capacitors is the difference of the charge on the respective reference feedback capacitor and the corresponding input capacitor. The input capacitors and reference feedback capacitors are then not stacked on the reference signals for providing the signals subtraction.

The invention also provides a method of operating at least a first switched capacitor integration stage of an electronic device for analog-to-digital conversion. The analog input signal is double sampled during each clock cycle. The reference feedback voltage is also double sampled during each clock cycle. The polarity of the analog input signal and the polarity of the integration capacitors can be periodically or randomly changed. If a periodic change is used, the frequency of changing the polarity may correspond to the main clock frequency divided by any positive integer greater than 1 (i.e. for example half the frequency of the main clock, a quarter or an eighth of the frequency of the main clock etc.). This is performed in order to apply a chopper-principle to the signal path. The sets of reference feedback capacitors are periodically and randomly exchanged, which provides that mismatch between the different reference feedback path is modulated.

The present invention avoids periodic use of sets of reference feedback capacitors. This provides that the total harmonic distortion is reduced and that differential and integral non-linearity as well as the signal to noise ratio is improved. Furthermore, using a pseudo-random selection of sets of reference feedback capacitors is more useful than a pseudo-random selection of sets of input capacitors as any capacitor mismatch in the reference feedback path affects the modulator output much more than a mismatch of input capacitors. The frequency distribution of the pseudo-random signal can be the same as the one of the signal used for chopping the integrator.

The frequency distribution of the pseudo-random (either for changing the polarity of the input signal and/or for selecting the sets of reference feedback capacitors) signal can show a noise shaping behavior of first or higher order.

BRIEF DESCRIPTION OF DRAWINGS

For a more complete understanding of the present invention, and the advantages thereof, reference is now made to the following descriptions taken in conjunction with the accompanying drawings, in which:

FIG. 1 shows a system theoretical representation of a Delta-Sigma modulator according to the prior art to which the present invention applies;

FIG. 2 shows a simplified circuit diagram of a second order Delta-Sigma modulator according to the prior art to which the present invention applies;

DETAILED DESCRIPTION OF AN EXAMPLE EMBODIMENTS

Figure 3:
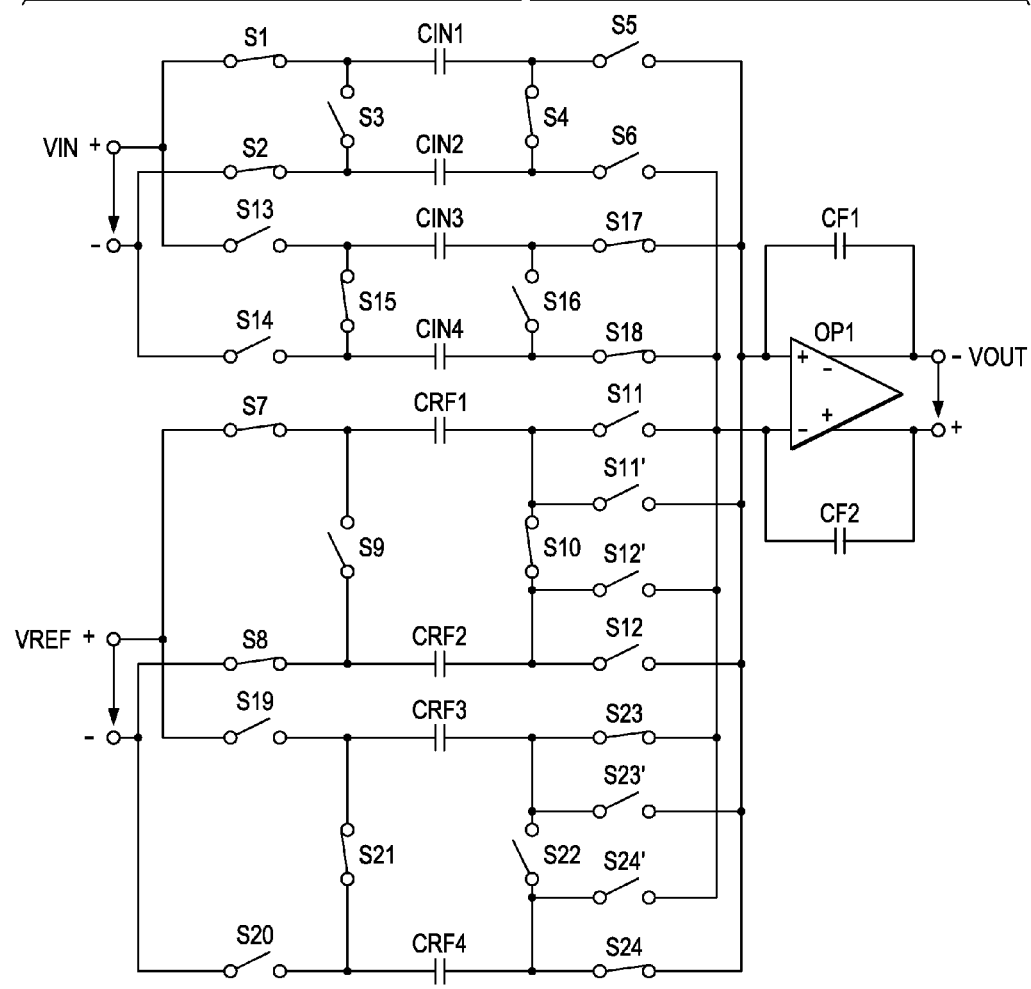
FIG. 3 shows a simplified circuit diagram of an integration stage according to aspects of the invention in the first double sampling phase.
Figure 4:
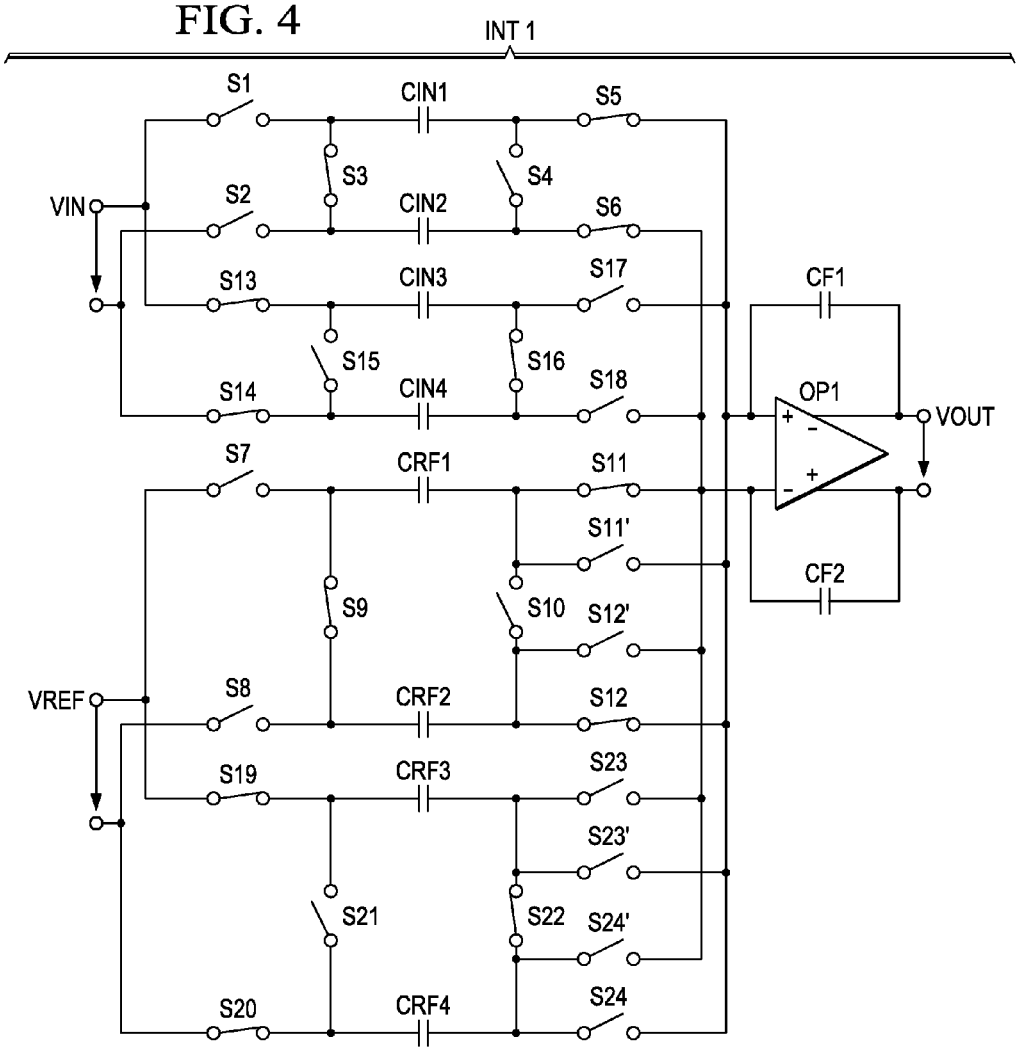
FIG. 4 shows a simplified circuit diagram of an integration stage according to aspects of the invention in the second double sampling phase.

FIG. 2 shows a more detailed simplified circuit diagram of the second order Delta-Sigma modulator shown in FIG. 1. A first integration stage is formed by operational amplifier OP1 and capacitors C1, C2 and C3. The second integration stage is formed by capacitors C4 and C5 and operational amplifier OP2. The outputs of the first integration stage and the second integration stage as well as the input voltage VIN are sampled on capacitors C6, C7 and C8 and summed up in order to be fed to one input of comparator COMP. The input of comparator COMP is supplied with the reference voltage VREF. The comparator COMP provides the output signal of the modulator MODOUT. The output signal MODOUT is given to an inverting 1-bit analog to digital converter. The resulting converted signal is fed back to the first integration stage through capacitor C1. The input signal VIN is sampled on capacitor C2 in order to be fed to the operational amplifier OP1. According to the present invention, an improved architecture and sampling scheme for the first integration stage can be used. FIG. 3 and FIG. 4 each show a first integration stage INT1 according to an embodiment of the invention and a set of input capacitors and a set of reference feedback capacitors. FIG. 3 shows the integration stage in INT1 a first double sampling phase and FIG. 4 shows the integration stage in INT1 in a subsequent second double sampling phase.

In FIG. 3, switches S1 to S24 are in a position that relates to a first double sampling phase of the first integration stage of the fully differential Delta-Sigma modulator. In the following description, a switch is referred to as "OFF" if it is not conducting (disconnecting). A switch is referred to as "ON" if it is conducting (or connecting). There are four input capacitors CIN1, CIN2, CIN3 and CIN4. Furthermore, there are four reference feedback capacitors CRF1, CRF2, CRF3 and CRF4. There are also two integrating capacitors of the operational amplifier OP1 which are referred to as CF1 and CF2. CF1 is coupled with a first side to the positive input of the operational amplifier and with a second side to the negative output of operational amplifier OP1. CF2 is coupled with a first side to the negative input of the operational amplifier and with a second side to the positive output of operational amplifier OP1. The shown architecture is fully differential. This means that input and reference signals are processed in a symmetric manner. Accordingly, there is a positive input voltage level VIN+ and a negative input voltage level VIN−, a positive reference voltage level VREF+ and a negative reference voltage level VREF− as well as a positive output voltage level VOUT+ and a negative output voltage level VOUT−. The input voltage VIN, the reference voltage VREF and the output voltage VOUT are all differential signals. In order to perform double sampling, two pairs of input capacitors, i.e. CIN1, CIN2, CIN3 and CIN4 as well as the two pairs of reference feedback capacitors CRF1, CRF2, CRF3 and CRF4 are provided. The respective positive and negative input voltage levels VIN+, VIN− are either sampled on the first pair CIN1, CIN2 or on the second pair CIN3, CIN4. The respective positive and negative reference voltage level VREF+, VREF− are either sampled on the first pair of reference feedback capacitors CRF1, CRF2 or on the second pair of reference feedback capacitors CRF3, CRF4.

Switch 51 is coupled between the positive input voltage level VIN+ and a first side of the first input capacitor CIN1. Switch S2 is coupled between the negative input voltage level VIN− and a first side of the second input capacitor CIN2. Switch S3 is coupled between the first sides of the first input capacitor CIN1 and the second input capacitor CIN2. Switch S5 is coupled between the second side of the first input capacitor CIN1 and the positive input of operational amplifier OP1. Switch S6 is coupled between the second side of the second input capacitor CIN2 and the negative input of operational amplifier OP1. Switch S4 is coupled between the second sides of the first input capacitor CN1 and the second input capacitor CN2.

Switch S13 is coupled between the positive input voltage level VIN+ and a first side of the third input capacitor CIN3. Switch S14 is coupled between the negative input voltage level VIN− and a first side of the fourth input capacitor CIN4. Switch S15 is coupled between the first sides of the third input capacitor CIN3 and the fourth input capacitor CIN4. Switch S17 is coupled between the second side of the third input capacitor CIN3 and the positive input of operational amplifier OP1. Switch S18 is coupled between the second side of the fourth input capacitor CIN4 and the negative input of operational amplifier OP1. Switch S16 is coupled between the second sides of the third input capacitor CN3 and the fourth input capacitor CN4.

Switch S7 is coupled between the positive reference voltage level VREF+ and a first side of the first reference feedback capacitor CRF1. Switch S8 is coupled between the negative reference voltage level VREF− and a first side of the second reference feedback capacitor CRF2. Switch S9 is coupled between the first sides of the first reference feedback capacitor CRF1 and the second reference feedback capacitor CRF2. Switch S11 is coupled between the second side of the first reference feedback capacitor CRF1 and the negative input of operational amplifier OP1. Switch S12 is coupled between the second side of the second reference feedback capacitor CRF2 and the positive input of operational amplifier OP1. Furthermore, there is switch S11' is coupled between the second side of the first reference feedback capacitor CRF1 and the positive input of operational amplifier OP1. Switch S12' is coupled between the second side of the second reference feedback capacitor CRF2 and the negative input of operational amplifier OP1. Switch S10 is coupled between the second sides of the first reference feedback capacitor CRF1 and the second reference feedback capacitor CF2.

Switch S19 is coupled between the positive reference voltage level VREF+ and a first side of the third reference feedback capacitor CRF3. Switch S20 is coupled between the negative reference voltage level VREF− and a first side of the fourth reference capacitor CRF4. Switch S21 is coupled between the first sides of the third reference feedback capacitor CRF3 and the fourth reference feedback capacitor CRF4. Switch S23 is coupled between the second side of the third reference feedback capacitor CRF3 and the negative input of operational amplifier OP1. Switch S24 is coupled between the second side of the fourth reference capacitor CRF4 and the positive input of operational amplifier OP1. Furthermore, there switch S23' is coupled between the second side of the third reference feedback capacitor CRF3 and the positive input of operational amplifier OP1. Switch S24' is coupled between the second side of the fourth reference feedback capacitor CRF4 and the negative input of operational amplifier OP1. Switch S22 is coupled between the second sides of the third reference feedback capacitor CRF3 and the fourth reference feedback CRF4. Switches 51, S2, S4, S15, S17, S18, S7, S8, S10, S21, S23 and S24 are conducting. Switches S3, S5, S6, S13, S14, S16, S9, S11, S12, S11', S12', S23', S24', S19, S20 and S22 are not conducting.

The state of switches S23, S23', S24, S24', 511, 511', S12 and S12' depends on the output value of the comparator.

FIG. 4 shows a simplified circuit diagram of the first integrator according to an embodiment of the invention during the subsequent second double sampling phase. The circuit is similar to the one shown in FIG. 3 despite the state of the switches which do now relate to the integration phase instead of the charging phase and vice versa. Accordingly, the switches S1, S2, S4, S15, S17, S18, S7, S8, S10, S11', S12', 521, S23, S23', S24 and S24' are disconnecting. Switches S3, S5, S6, S16, S13, S14, S9, S11, S12, S19, S20 and S22 are connecting.

Figure 5:
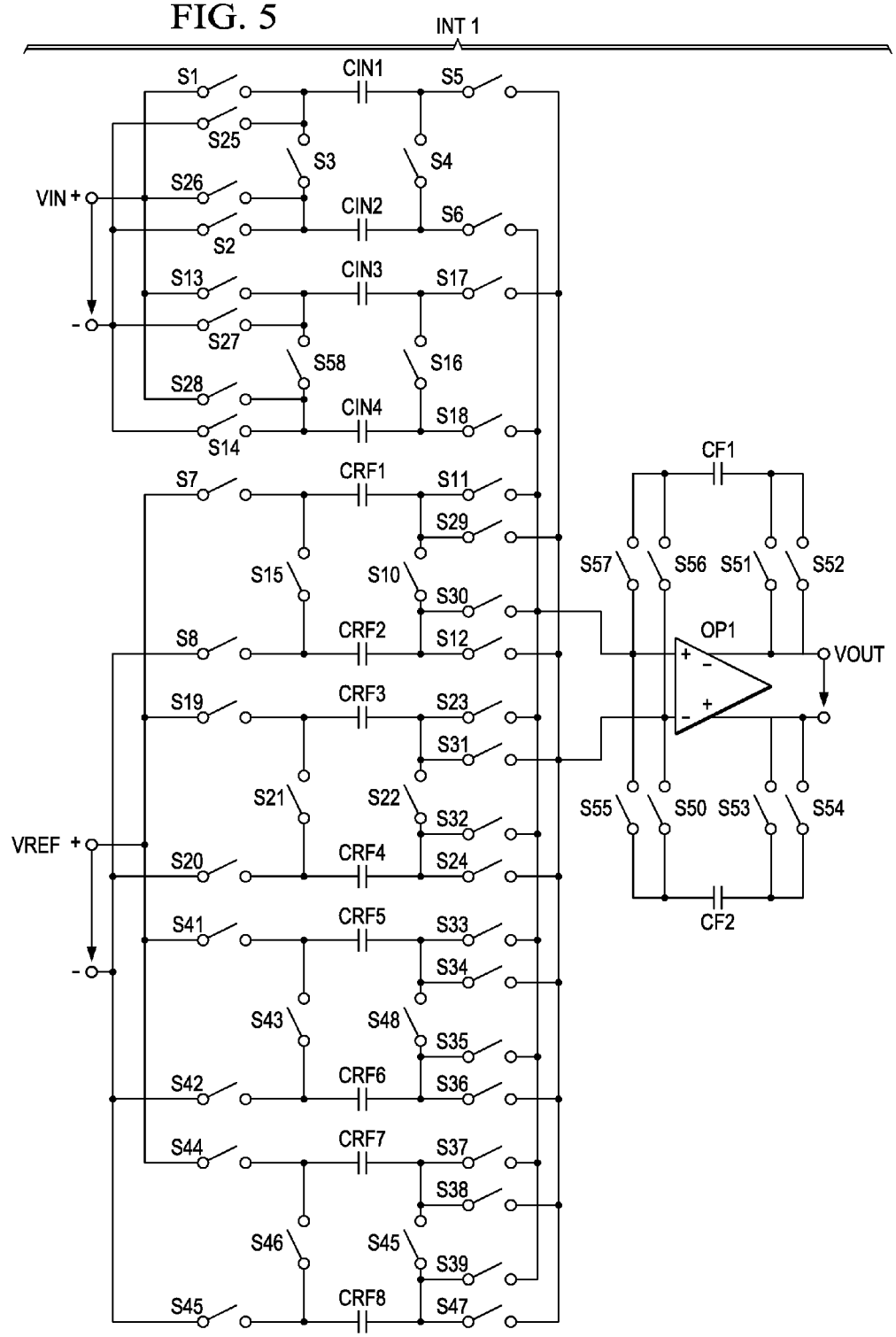
FIG. 5 shows a simplified circuit diagram of a first integration stage according to aspects of the invention.

FIG. 5 shows a simplified circuit diagram of a first integration stage according to another embodiment of the invention. There are two pairs of input capacitors CIN1, CIN2 and CIN3, CIN4. There are now four sets of reference feedback capacitors CRF1, CRF2 as the first pair CRF3, CRF4 as the second pair, CRF5, CRF6 as the third pair and CRF7, CRF8 as the fourth pair. The input sampling stage comprising capacitors CIN1, CIN2, CIN3 and CIN4 and the integration capacitors of the integration stage are now configured as a chopper stage that allows changing the polarity of the sampled input voltages and the polarity of the integration capacitors with respect to inputs and outputs of the operational amplifier OP1. Therefore, further switches S25, S26, S27 and S28 are provided between the input voltage VIN and the first sides of the input capacitors. Most of the other switches are coupled as previously described with respect to FIG. 3. In addition to the circuit shown in FIG. 3, switch S25 is coupled between the first side of the first input capacitor CIN1 and the negative input voltage level VIN−. Switch S26 is coupled between the first side of the second input capacitor CIN2 and the positive input voltage level VIN+. Switch S27 is coupled between the negative input voltage level VIN− and the first side of the third input capacitor CIN3. Switch S28 is coupled between the positive input voltage level VIN+ and the first side of the fourth input capacitor CIN4. Furthermore, switch S3 is coupled between the first sides of capacitors CIN1 and CIN2. Switch S58 is coupled between the first sides of capacitors CIN3 and CIN4. The reference voltage sampling stage is now configured to randomly select pairs (sets) of reference feedback capacitors in order to suppress any influence of mismatch between the capacitors.

Switch S7 is coupled between the positive reference voltage level VREF+ and a first side of the first reference feedback capacitor CRF1. Switch S8 is coupled between the negative reference voltage level VREF− and a first side of the second reference feedback capacitor CRF2. Switch S15 is coupled between the first sides of the first reference feedback capacitor CRF1 and the second reference feedback capacitor CRF2. Switch S11 is coupled between the second side of the first reference feedback capacitor CRF1 and the positive input of operational amplifier OP1. Switch S12 is coupled between the second side of the second reference feedback capacitor CRF2 and the negative input of operational amplifier OP1. Switch S10 is coupled between the second side of the first reference feedback capacitor CRF1 and the second reference feedback capacitor CF2. Furthermore, there is switch S29, which is coupled between the second side of the first reference feedback capacitor CRF1 and the negative input of operational amplifier OP1. Switch S30 is coupled between the second side of the second reference feedback capacitor CRF2 and the positive input of operational amplifier OP1.

Switch S19 is coupled between the positive reference voltage level VREF+ and a first side of the third reference feedback capacitor CRF3. Switch S20 is coupled between the negative reference voltage level VREF− and a first side of the fourth reference feedback capacitor CRF4. Switch S21 is coupled between the first sides of the third reference feedback capacitor CRF3 and the fourth reference feedback capacitor CRF4. Switch S23 is coupled between the second side of the third reference feedback capacitor CRF3 and the positive input of operational amplifier OP1. Switch S24 is coupled between the second side of the fourth reference capacitor CRF4 and the negative input of operational amplifier OP1. Switch S22 is coupled between the second sides of the third reference feedback capacitor CRF3 and the fourth reference feedback CRF4. Switch S31 is coupled between the second side of the third reference feedback capacitor CRF3 and the negative input of operational amplifier OP1. Switch S32 is coupled between the second side of the fourth reference feedback capacitor CRF4 and the positive input of operational amplifier OP1.

Switch S41 is coupled between the positive reference voltage level VREF+ and a first side of the fifth reference feedback capacitor CRF5. Switch S42 is coupled between the negative reference voltage level VREF− and a first side of the sixth reference feedback capacitor CRF6. Switch S43 is coupled between the first sides of the fifth reference feedback capacitor CRF5 and the sixth reference feedback capacitor CRF6. Switch S33 is coupled between the second side of the fifth reference feedback capacitor CRF5 and the positive input of operational amplifier OP1. Switch S36 is coupled between the second side of the sixth reference feedback capacitor CRF6 and the negative input of operational amplifier OP1. Switch S48 is coupled between the second sides of the fifth reference feedback capacitor CRF5 and the sixth reference feedback capacitor CF6. Furthermore, there is switch S34, which is coupled between the second side of the fifth reference feedback capacitor CRF5 and the negative input of operational amplifier OP1. Switch S35 is coupled between the second side of the sixth reference feedback capacitor CRF6 and the positive input of operational amplifier OP1.

Switch S44 is coupled between the positive reference voltage level VREF+ and a first side of the seventh reference feedback capacitor CRF7. Switch S45 is coupled between the negative reference voltage level VREF− and a first side of the eighth reference capacitor CRF8. Switch S46 is coupled between the first sides of the seventh reference feedback capacitor CRF7 and the eighth reference feedback capacitor CRF8. Switch S37 is coupled between the second side of the seventh reference feedback capacitor CRF7 and the positive input of operational amplifier OP1. Switch S47 is coupled between the second side of the eighth reference capacitor CRF8 and the negative input of operational amplifier OP1. Switch S49 is coupled between the second sides of the seventh reference feedback capacitor CRF7 and the eighth reference feedback CRF8. Switch S38 is coupled between second side of the seventh reference feedback capacitor CRF7 and the negative input of operational amplifier OP1. Switch S39 is coupled between the second side of the eighth reference feedback capacitor CRF8 and the positive input of operational amplifier OP1.

Switch S50 is coupled between the negative input of operational amplifier OP1 and a first side of capacitor CF2. Switch S55 is coupled between the positive input of operational amplifier OP1 and the first side of capacitor CF2. Switch S57 is coupled between the positive input of operational amplifier OP1 and a first side of capacitor CF1. Switch S56 is coupled between the negative input of operational amplifier OP1 and the first side of capacitor CF1. Switch S51 is coupled between the negative output of operational amplifier OP1 and the second side of capacitor CF1. Switch S52 is coupled between the positive output of operational amplifier OP1 and the second side of capacitor CF1. Switch S53 is coupled between the negative output of operational amplifier OP1 and the second side of capacitor CF2. Switch S54 is coupled between the positive output of operational amplifier OP1 and the second side of capacitor CF2.

The previously described configuration of switches and capacitors with respect to the fully differential operational amplifier OP1 allows the first integrator INT1 shown in FIG. 5 to perform double sampling in combination with a chopping principle of the signal path and random selection of pairs of reference feedback capacitors in the feedback path of the reference signal VREF. The random signal for selecting the pairs of reference feedback capacitors is advantageously a separate signal, i.e. it is not derived, for example from the modulator output signal or the like. This reduces the risk of distortion due to signal correlation.

Figure 6A:
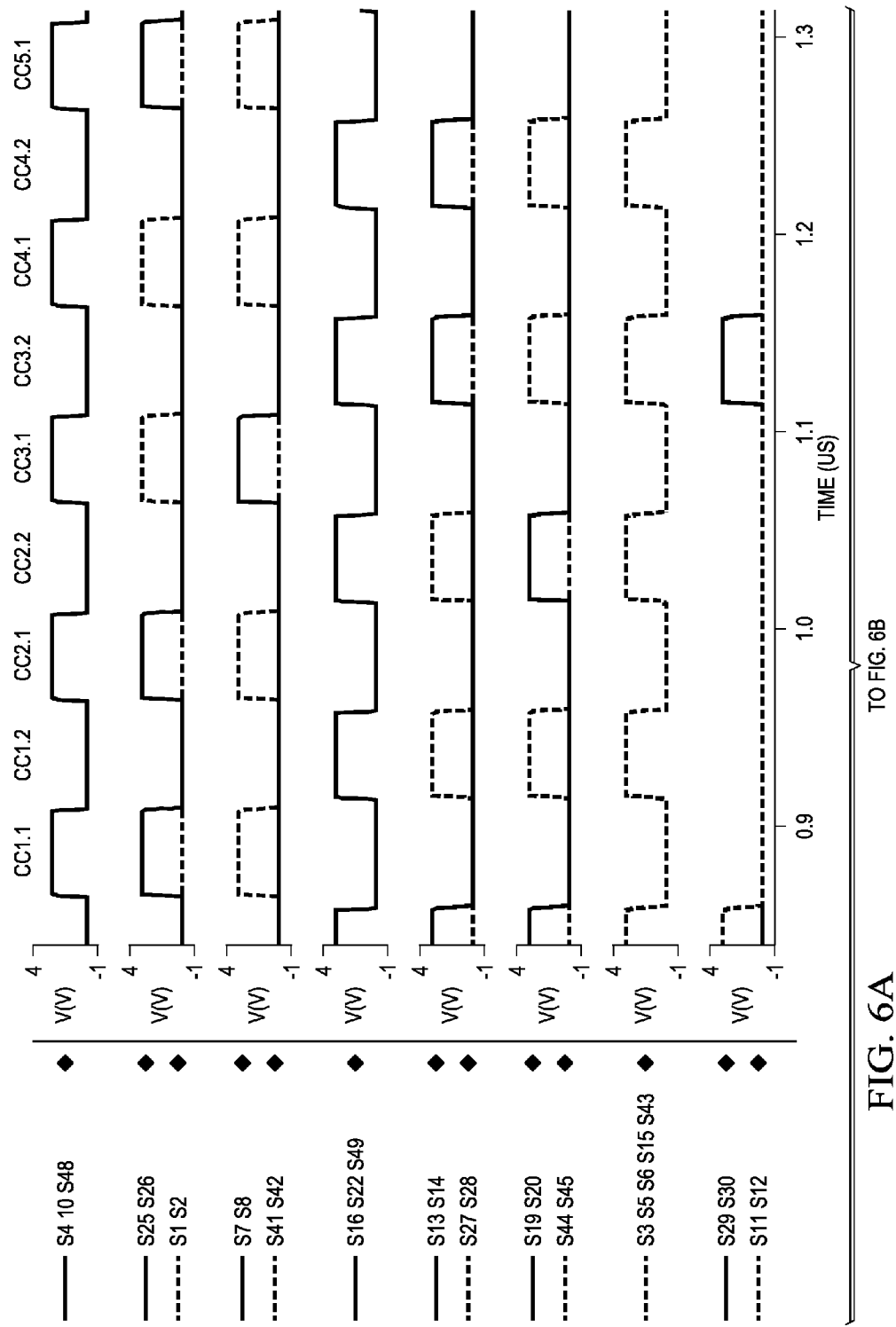
FIG. 6 shows waveforms relating to the control signals of the switches of the embodiment shown in FIG. 5.
Figure 6B:
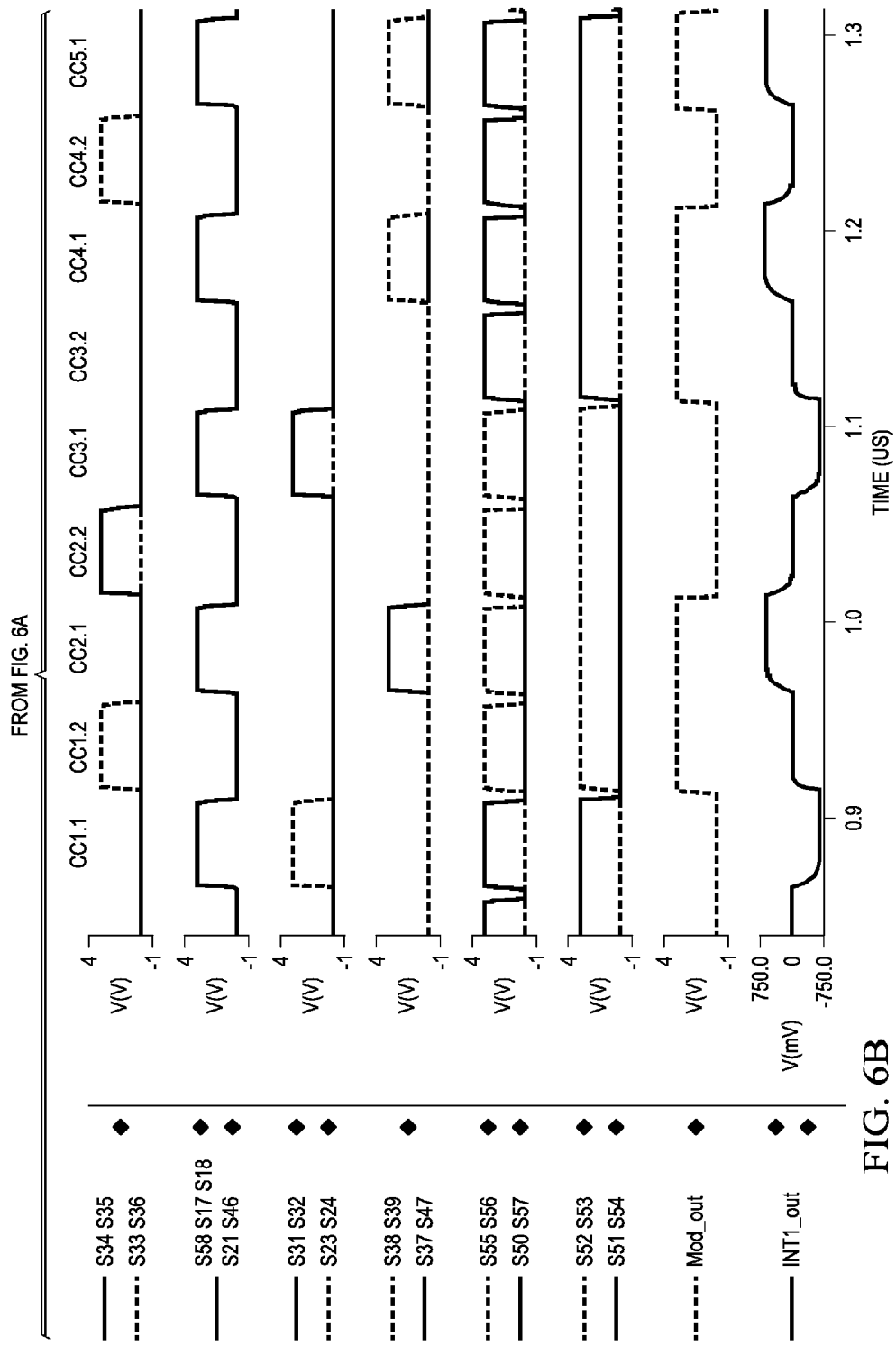

First and second portions of each clock cycle are periods of about (a bit less than) half the clock cycle taking into account that non-overlapping clock signals are used. Therefore, a portion of a clock cycle can not span the entire duration of half a clock cycle. FIG. 6 shows waveforms relating to the control signals of the switches of the embodiment shown in FIG. 5. A high level (ON) of a control signal indicates that the switch is conducting, a low level (OFF) indicates that the switch is not conducting. The following table indicates the states of the signals for each half clock cycle CC1.1 to CC5.1.

| Switch No. | CC1.1 | CC1.2 | CC2.1 | CC2.2 | CC3.1 | CC3.2 | CC4.1 | CC4.2 | CC5.1 |
|---|---|---|---|---|---|---|---|---|---|
| 4, 10, 48 | ON | OFF | ON | OFF | ON | OFF | ON | OFF | ON |
| 25, 26 | ON | OFF | ON | OFF | OFF | OFF | OFF | OFF | ON |
| 1, 2 | OFF | OFF | OFF | OFF | ON | OFF | ON | OFF | OFF |
| 7, 8 | OFF | OFF | OFF | OFF | ON | OFF | OFF | OFF | OFF |
| 41, 42 | ON | OFF | ON | OFF | OFF | OFF | ON | OFF | ON |
| 16, 22, 49 | OFF | ON | OFF | ON | OFF | ON | OFF | ON | OFF |
| 13, 14 | OFF | OFF | OFF | OFF | OFF | ON | OFF | ON | OFF |
| 27, 28 | OFF | ON | OFF | ON | OFF | OFF | OFF | OFF | OFF |
| 19, 20 | OFF | OFF | OFF | ON | OFF | OFF | OFF | OFF | OFF |
| 44, 45 | OFF | ON | OFF | OFF | OFF | ON | OFF | ON | OFF |
| 3, 5, 6, 15, 43 | OFF | ON | OFF | ON | OFF | ON | OFF | ON | OFF |
| 29, 30 | OFF | OFF | OFF | OFF | OFF | ON | OFF | OFF | OFF |
| 11, 12 | OFF | OFF | OFF | OFF | OFF | OFF | OFF | OFF | OFF |
| 34, 35 | OFF | OFF | OFF | ON | OFF | OFF | OFF | OFF | OFF |
| 33, 36 | OFF | ON | OFF | OFF | OFF | OFF | OFF | ON | OFF |
| 58, 17, 18, 21, 46 | ON | OFF | ON | OFF | ON | OFF | ON | OFF | ON |
| 31, 32 | OFF | OFF | OFF | OFF | ON | OFF | OFF | OFF | OFF |
| 23, 24 | ON | OFF | OFF | OFF | OFF | OFF | OFF | OFF | OFF |
| 38, 39 | OFF | OFF | OFF | OFF | OFF | OFF | ON | OFF | ON |
| 37, 47 | OFF | OFF | ON | OFF | OFF | OFF | OFF | OFF | OFF |
| 55, 56 | OFF | ON | ON | ON | ON | OFF | OFF | OFF | OFF |
| 50, 57 | ON | OFF | OFF | OFF | OFF | ON | ON | ON | ON |
| 52, 53 | OFF | ON | ON | ON | ON | OFF | OFF | OFF | OFF |
| 51, 54 | ON | OFF | OFF | OFF | OFF | ON | ON | ON | ON |
| Mod_out | 0 | 1 | 1 | 0 | 0 | 1 | 1 | 0 | 1 |
| INT1_out | See FIG. 6 | | | | | | | | |

Mod_out is the digital signal at the modulator output and INT1_out is the analog and continuous signal at the output of the integrator.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An electronic device for analog-to-digital conversion according to Delta-Sigma modulation comprising at least a first switched capacitor integration stage, a second switched capacitor integration stage and a single-bit comparator, wherein the first switched capacitor integration stage is implemented in a fully differential architecture and comprises: an operational amplifier, a plurality of sets of input sampling capacitors for sampling an analog input voltage and a plurality of sets of reference feedback capacitors for sampling a feedback reference voltage, and wherein the first integration stage is further configured to sample the analog input voltage on a first set of input capacitors out of the plurality of sets of input capacitors during a first portion of a clock cycle and on a second set out of the plurality of sets of input capacitors during a second portion of the clock cycle and to sample the feedback reference voltage on a first set of reference feedback capacitors out of the plurality of sets of reference feedback capacitors during the first portion of the clock cycle and on a second set of reference feedback capacitors out of the plurality of sets of reference feedback capacitors during the second portion of the clock cycle and wherein the first set of reference feedback capacitors and the second set of reference feedback capacitors are randomly selected out of the plurality of sets of reference feedback capacitors from clock cycle to clock cycle.

2. The electronic device according to claim 1, wherein the electronic device is configured to periodically or randomly change the polarity of the analog input voltage with respect to each set of input capacitors.

3. The electronic device according to claim 1 wherein the plurality of reference feedback capacitors comprises more than two pairs of capacitors each pair representing a randomly selected set of feedback capacitors.

4. The electronic device according to claim 1, wherein the plurality of input capacitors comprises two pairs of capacitors each pair representing a set of input capacitors.

5. A method of operating at least a first switched capacitor integration stage of an electronic device for analog-to-digital conversion according to Delta-Sigma modulation comprising: double sampling the analog input signal during each clock cycle, double sampling the reference feedback voltage during each clock cycle, periodically or randomly changing the polarity of the analog input signal with respect to any used input sampling capacitors in order to apply a chopper principle to the input signal, periodically and randomly changing sets of reference feedback capacitors out of a plurality of sets of reference feedback capacitors for sampling the feedback reference voltage.

* * * * *